(12) United States Patent
Yang et al.

(10) Patent No.: US 9,391,276 B2
(45) Date of Patent: Jul. 12, 2016

(54) CONJUGATED POLYMER-BASED OPTOELECTRONIC MATERIAL

(71) Applicant: National Tsing Hua University, Hsinchu (TW)

(72) Inventors: Arnold Chang-Mou Yang, Hsinchu (TW); Yen-Hui Liu, Kaohsiung (TW); Chih-Chia Cheng, Linnei Township (TW); Cheng-Chung Huang, Kaohsiung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/547,392

(22) Filed: Nov. 19, 2014

(65) Prior Publication Data
US 2016/0043322 A1 Feb. 11, 2016

(30) Foreign Application Priority Data

Aug. 7, 2014 (TW) .............................. 103127057 A

(51) Int. Cl.
| | |
|---|---|
| *C08C 19/00* | (2006.01) |
| *H01L 51/00* | (2006.01) |
| *C08G 75/06* | (2006.01) |
| *C09D 181/02* | (2006.01) |
| *C08F 8/00* | (2006.01) |

(52) U.S. Cl.
CPC ............. *H01L 51/0036* (2013.01); *C08G 75/06* (2013.01); *C09D 181/02* (2013.01)

(58) Field of Classification Search
CPC ..................................... C08F 8/00; C08F 8/14
USPC ............................ 525/384; 528/373, 377, 380
See application file for complete search history.

(56) References Cited

U.S. PATENT DOCUMENTS 8,440,785 B2 * 5/2013 Brown ................. C07D 495/04
528/370

FOREIGN PATENT DOCUMENTS

CN 102093571 A 6/2011

* cited by examiner

*Primary Examiner* — Terressa Boykin
(74) *Attorney, Agent, or Firm* — Birch, Stewart, Kolasch & Birch, LLP

(57) ABSTRACT

A conjugated polymer-based optoelectronic material includes: an optoelectronic conjugated polymer having a main chain and side chains; and an organic diluent which is at least partially miscible with the conjugated polymer. Molecules of the organic diluent physically react with the side chains of the conjugated polymer to form hydrogen bonds therebetween, thereby generating molecular constraints in the conjugated polymer to suppress molecular deformation of the conjugated polymer that occurs soon after the conjugated polymer is excited.

10 Claims, 3 Drawing Sheets

CONJUGATED POLYMER-BASED OPTOELECTRONIC MATERIAL

CROSS-REFERENCE TO RELATED APPLICATION

This application claims priority of Taiwanese Patent Application No. 103127057, filed on Aug. 7, 2014.

FIELD OF THE INVENTION

This invention relates to a conjugated polymer-based optoelectronic material, more particularly to a conjugated polymer-based optoelectronic material including an optoelectronic conjugated polymer and an organic diluent reacting with the optoelectronic conjugated polymer to form hydrogen bonds therebetween.

DESCRIPTION OF THE RELATED ART

Conjugated polymers have been used as active materials in optoelectronic semiconductor thin film devices, such as organic light emitting diodes, solar cells, photo-detectors, etc.

Conventional conjugated polymers, such as polythiophene, useful for forming solid thin films, are long linear molecular strands that tend to undergo molecular deformation via facile bond rotations that may occur soon after electro-excitation (through photoexcitation or electric excitation). As a consequence, conjugated polymers tend to trap excited states (such as excitons) through local molecular deformations, thereby resulting in a decrease in the quantum efficiencies.

SUMMARY OF THE INVENTION

Therefore, an object of the present invention is to provide a conjugated polymer-based optoelectronic material that can overcome the aforesaid drawback associated with the prior art.

According to this invention, there is provided a conjugated polymer-based optoelectronic material that includes: an optoelectronic conjugated polymer having a main chain and side chains; and an organic diluent which is at least partially miscible with the conjugated polymer. Molecules of the organic diluent physically react with the side chains of the conjugated polymer to form hydrogen bonds therebetween, thereby generating molecular constraints in the conjugated polymer to suppress molecular deformation of the conjugated polymer that may occur soon after the conjugated polymer is excited.

BRIEF DESCRIPTION OF THE DRAWINGS

In drawings which illustrate embodiments of the invention.

DETAILED DESCRIPTION OF THE EMBODIMENTS

Figure 1A:
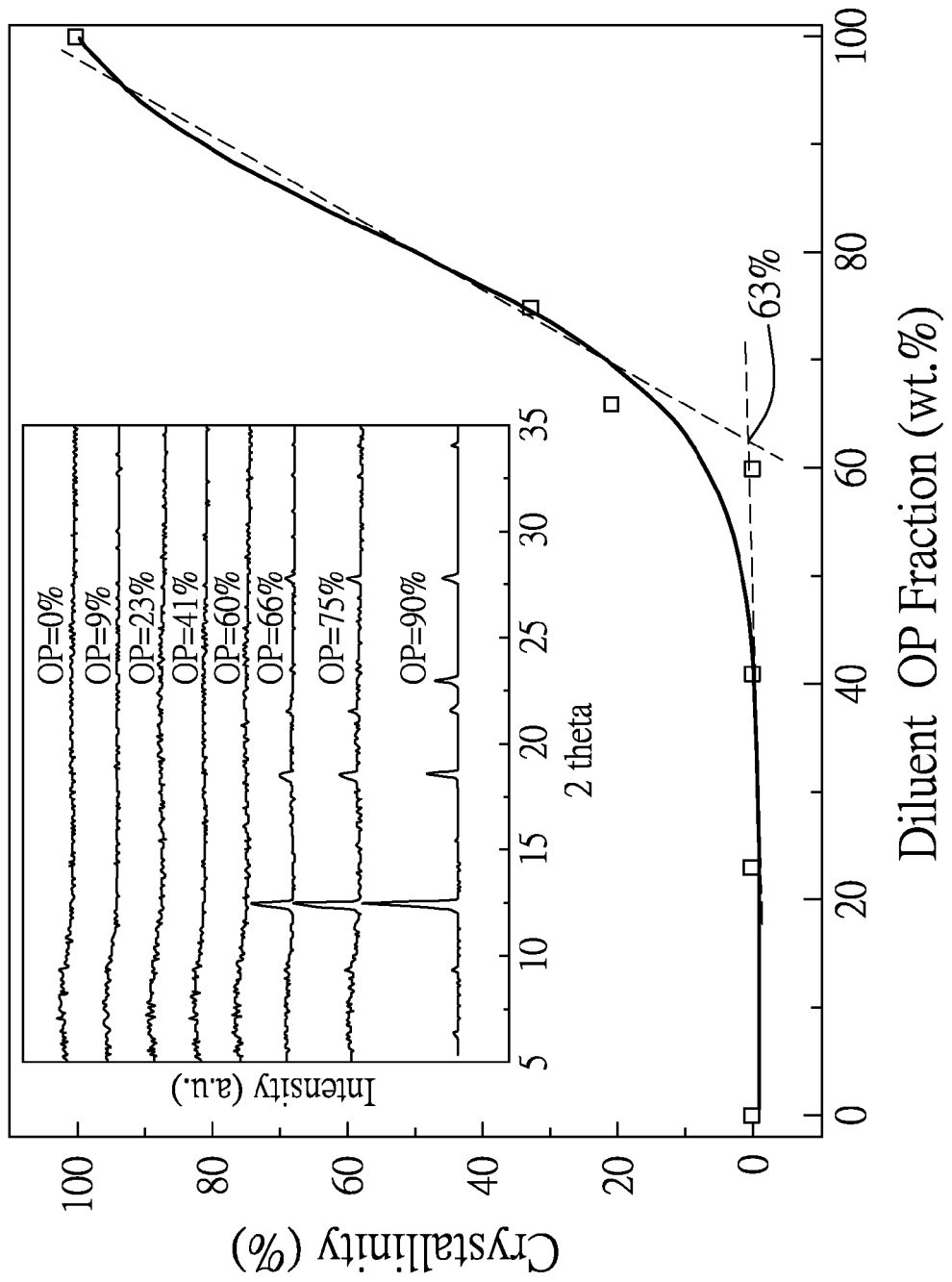
FIG. 1a is a plot of the crystallinity of (poly[2-(thiophen-3-yl)ethyl acetate]/4-octylphenol) (PTEA/OP) film vs OP weight fraction.

The embodiment of a conjugated polymer-based optoelectronic material according to the present invention includes: an optoelectronic conjugated polymer having a main chain and side chains; and an organic diluent which is at least partially miscible with the conjugated polymer, so that molecules of the diluent may be dispersed among the side chains of the conjugated polymer. The molecules of the organic diluent physically react with the side chains of the conjugated polymer to form hydrogen bonds therebetween, thereby generating molecular constraints in the conjugated polymer to suppress molecular deformation of the conjugated polymer that may occur soon after the conjugated polymer is excited through either photo-excitation or electro-excitation. The conjugated polymer-based optoelectronic material exhibits improved optoelectronic efficiency, and may be useful as semiconductor active materials in electronic devices, such as thin film transistors, photovoltaic cells, organic/polymer light emitting diodes, and the like.

Preferably, each of the side chains of the conjugated polymer has at least one group that is selected from one of a hydrogen bond donor group and a hydrogen bond acceptor group, and each of the molecules of the organic diluent has at least one group that is selected from the other of the hydrogen bond donor group and the hydrogen bond acceptor group so as to permit formation of the hydrogen bonds between the conjugated polymer and the organic diluent.

Examples of the hydrogen bond acceptor group may include, but are not limited to, R—C=O, —COOR, —F, etc.

Examples of the hydrogen bond donor group may include, but are not limited to, —COOH, —OH, —NH$_2$, etc.

Preferably, the organic diluent is in an amount of greater than 9 wt % and the conjugated polymer is in an amount of greater than 5 wt % based on a total weight of the conjugated polymer-based optoelectronic material. More preferably, the organic diluent is in an amount of greater than 40 wt % and the conjugated polymer is in an amount of greater than 35 wt % based on the total weight of the conjugated polymer-based optoelectronic material.

Examples of the main chain of the conjugated polymer may include, but are not limited to, polyethylne, polydiacetylene, poly(para-phenylene), poly(para-phenylene vinylene), polythiophene, polyaniline, polypyrrole, polyphenylene sulfide, and poly(9,9-dioctylfluorene-co-benzothiadiazole).

Preferably, the conjugated polymer is a thiophene derivative conjugated polymer, such as poly[2-(thiophen-3-yl)ethyl acetate] (PTEA) having the formula (I)

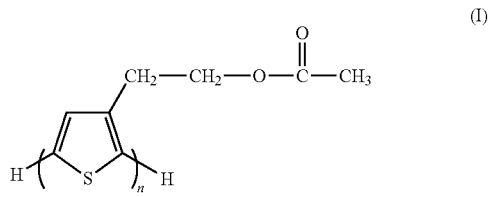

(I)

where n is an integer greater than 1. The main chain of PTEA contains repeating thiophene units. Each side chain contains an ethyl acetate with a (—C=O) group serving as the hydrogen bond acceptor group.

The organic diluent may be a low molecular weight polymer that has a molecular weight of less than 10,000 g/mole, preferably less than 2,000 g/mole, and more preferably less than 500 g/mole. Preferably, the organic diluent may be a conjugated polymer having a linear main chain.

Preferably, the organic diluent is a phenol derivative, such as 4-octylphenol which contains a hydroxyl group (—OH) serving as the hydrogen bond donor group.

The conjugated polymer-based optoelectronic material may be free of a solvent in the state of a solid thin film for application in the production of thin film transistors, photovoltaic cells, organic/polymer light emitting diodes, and the like.

The following Examples and Comparative Examples are provided to illustrate the embodiment of the invention, and should not be construed as limiting the scope of the invention.

EXAMPLE 1

10 mg poly[2-(thiophen-3-yl)ethyl acetate] (PTEA) having a molecular weight of 69,000 g/mole was dissolved in 1 g 1,1,2,2-tetrachloroethane (TCE) at 50° C. for 1 hr under stirring to form a PTEA solution. 10 mg 4-octylphenol (OP) serving as a diluent were added into the PTEA solution under stirring at 50° C. for 0.5 hr to form a diluted solution. The diluted solution was subjected to filtration using a syringe through a polytetrafluorethylene (PTFE) filter (0.45 μm pores). The filtrate was spin-coated under a spin speed of about 3500 rpm and dried on a silicon wafer for 20 seconds, thereby forming a solid thin film on the silicon wafer. The solid thin film having hydrogen bond interactions between PTEA and the molecules of OP has a PTEA weight fraction of 50 wt %, an OP weight fraction of 50 wt %, and a film thickness of 35 nm.

EXAMPLES 2-8

The procedures and conditions for preparing the solid thin films of Examples 2-8 were similar to those for Example 1, except for the concentration of OP. The OP weight fractions of the solid thin films of Examples 2-8 are respectively 9 wt %, 23 wt %, 41 wt %, 60 wt %, 66 wt %, 75 wt %, and 90 wt %.

Comparative Examples 1-8

Comparative Examples 1-8 correspond to Examples 1-8, respectively. The procedures and conditions for preparing the solid thin films for Comparative Examples 1-8 were respectively similar to those of Examples 1-8, except that the diluent was replaced with 1-phenyl-1-decanone (PD). It is noted that PD has a chemical structure similar to that of OP, but does not contain any hydrogen bond donor group. As a consequence, the solid thin films of Comparative Examples 1-8 do not have the hydrogen bond interactions between PTEA and the molecules of PD.

<Test Results>

The crystal morphology of the solid thin film in each of Examples 1-8 and Comparative Examples 1-8 was analyzed using X-ray diffraction (XRD) (Rigaku D-Max, Ni-filtered Cu Kα radiation λ=0.154 nm, 30 KV, 20 mA) in the range of from 5° to 35° under the scan rate of 2°/min.

Figure 1B:
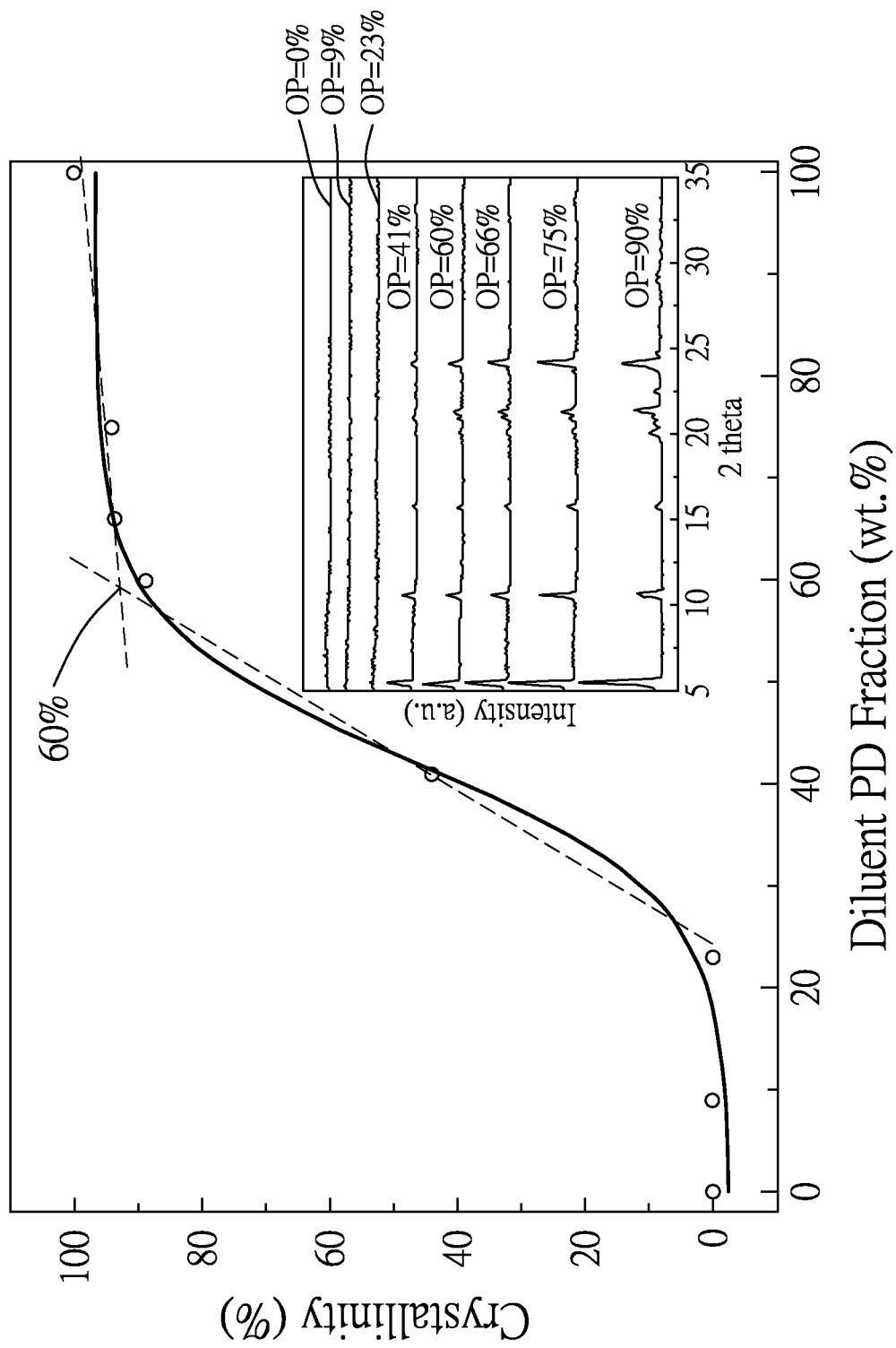
FIG. 1b is a plot of the crystallinity of the PTEA/1-phenyl-1-decanone (PD) film vs PD weight fraction.

FIGS. 1a and 1b are respectively plots of the crystallinity (%) obtained from the XRD measurement of the PTEA/OP film vs the weight fraction of the diluent OP ($c_{OP}$) and crystallinity (%) of the PTEA/PD film vs the weight fraction of the diluent PD ($c_{PD}$). The XRD results of Examples 1-8 show that the PTEA/OP film maintains a uniform amorphous phase when OP fraction is from 0% up to about 60% or when the PTEA fraction ($1-c_{PD}$) is from 100% down to about 40 wt %, showing no crystalline sharp peaks in the diffraction pattern. On the other hand, the XRD results of Comparative Examples 1-8 show that the PTEA/PD film maintains a uniform amorphous phase when PD fraction is from 0% up to about 23% or when the PTEA fraction ($1-c_{PD}$) is from 100% down to about 77 wt %. Clearly, a comparison between Examples 1-8 and Comparative Example 1-8 shows that the hydrogen bond interactions between PTEA and the molecules of the diluent effectively enhance the intermolecular interactions between the OP diluent molecules and the conjugated polymer PTEA, and hence significantly promotes the dispersion of the OP diluent molecules in the conjugated polymer with which the OP diluent molecules interact.

The photoluminescence properties of the solid thin films (PTEA/OP film) of Examples 1-8 and the solid thin films (PTEA/PD film) of Comparative Examples 1-8 were measured using a photoluminescence spectrometer (Perkin-Elmer LS55) under an excitation wavelength at 450 nm.

Figure 2:
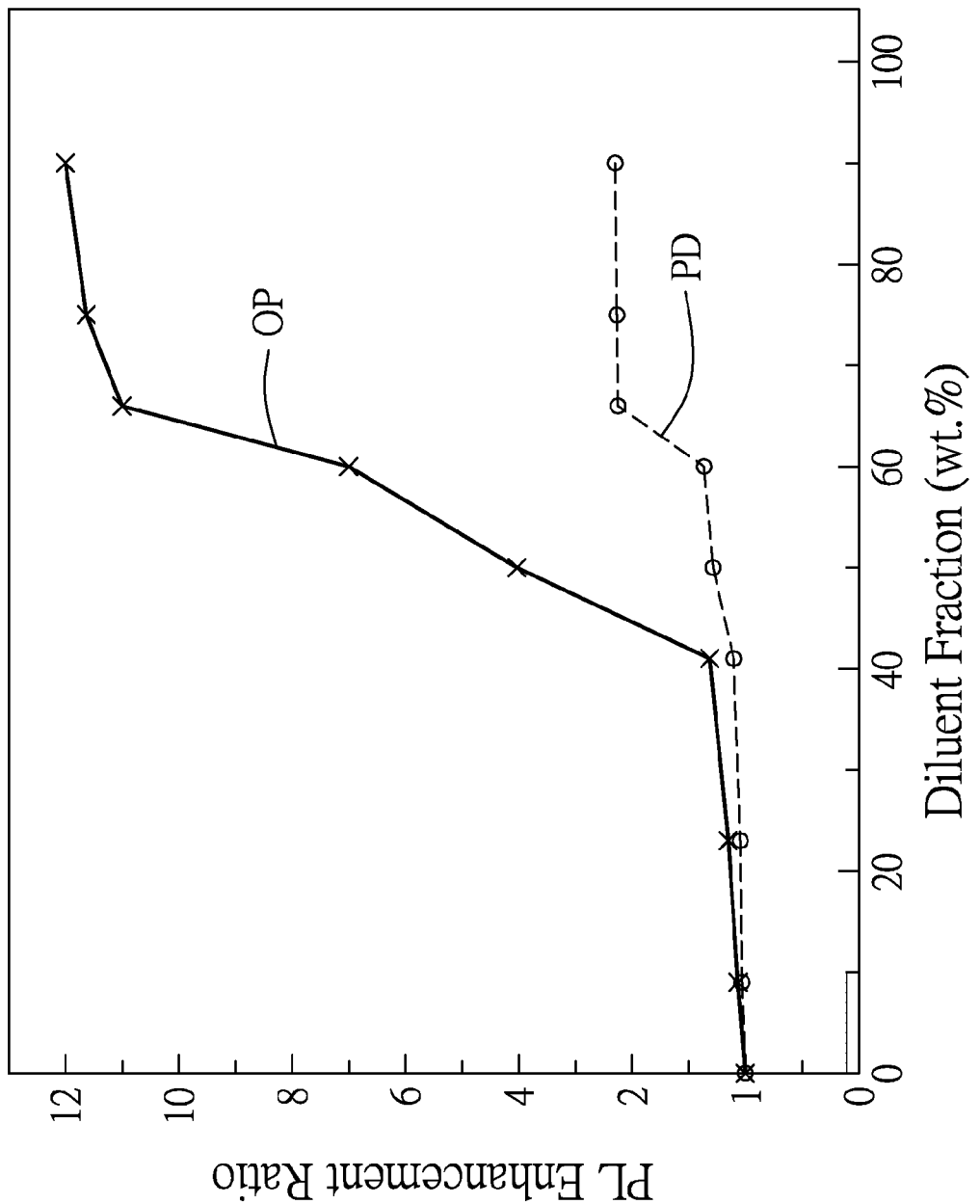
FIG. 2 shows plots of the photoluminescence enhancement ratio of the PTEA/OP film vs the OP weight fraction and the photoluminescence (PL) enhancement ratio of the PTEA/PD film vs the PD weight fraction, respectively.

FIG. 2 shows plots of the photoluminescence (PL) enhancement ratio (i.e., PL efficiency) of the PTEA/OP film vs the OP weight fraction ($c_{OP}$) and the PL enhancement ratio of the PTEA/PD film vs the PD weight fraction ($c_{PD}$), respectively, based on the emission property measurement. The PL enhancement ratio is defined as the ratio of the PL intensity of the PTEA/OP film or the PTEA/PD film, after normalization to the PTEA fraction, to the PL intensity of the PTEA (without OP and PD) film. As shown in FIG. 2, the PL efficiency of the PTEA/OP film (curve "OP") slightly increases with the OP fraction when the OP weight fraction is greater than about 9 wt %, then sharply increases with the OP fraction when the OP weight fraction is greater than about 40 wt %, and starts to level off at about 12 folds as the OP weight fraction becomes greater than about 75 wt % (when phase separation via crystallization takes place). On the other hand, the PL efficiency of the PTEA/PD film (curve "PD") slightly increases with the PD fraction when the PD weight fraction is greater than about 40 wt %, then sharply increases with the PD fraction when the PD weight fraction is greater than about 60 wt %, and starts to level off at about 2.0 folds as PD weight fraction becomes greater than about 65 wt %. A comparison between Examples 1-8 (with hydrogen bonds) and Comparative Examples 1-8 (without hydrogen bonds) shows that the hydrogen bond interactions between PTEA and the molecules of the diluent may effectively enhance the PL efficiency of the solid thin film. Particularly, when the OP weight fraction is greater than about 40 wt %, the PL enhancement is noticeable and unexpected.

Although only PTEA/OP and PTEA/PD systems are illustrated above, the comparison between Examples 1-8 and Comparative Examples 1-8 demonstrates that other combinations of conjugated polymers and diluents which are formed with hydrogen bond interactions therebetween may be expected to have the same effect on suppressing molecular deformations that are associated with the excitation of the conjugated polymers.

With the hydrogen bond interactions between the side chains of the conjugated polymer and the molecules of the diluent in the conjugated polymer-based optoelectronic material of the present invention, the aforesaid drawback associated with the prior art can be effectively alleviated.

While the present invention has been described in connection with what are considered the most practical embodiments, it is understood that this invention is not limited to the disclosed embodiments but is intended to cover various arrangements included within the spirit and scope of the broadest interpretation and equivalent arrangements.

What is claimed is:

1. A conjugated polymer-based optoelectronic material comprising:
   an optoelectronic conjugated polymer having a main chain and side chains; and an organic diluent which is at least partially miscible with said conjugated polymer;

wherein molecules of said organic diluent physically react with said side chains of said conjugated polymer to form hydrogen bonds therebetween, thereby generating molecular constraints in said conjugated polymer to suppress molecular deformation of said conjugated polymer that occurs soon after said conjugated polymer is excited;

wherein said organic diluent is present in an amount of greater than 9 wt % based on a total weight of said conjugated polymer-based optoelectronic material.

2. The conjugated polymer-based optoelectronic material of claim 1, wherein each of said side chains of said conjugated polymer has at least one group that is selected from one of a hydrogen bond donor group and a hydrogen bond acceptor group, and each of the molecules of said organic diluent has at least one group that is selected from the other of said hydrogen bond donor group and said hydrogen bond acceptor group so as to permit formation of said hydrogen bonds between said conjugated polymer and said organic diluent.

3. The conjugated polymer-based optoelectronic material of claim 1, wherein said conjugated polymer is present in an amount of greater than 5 wt % based on a total weight of said conjugated polymer-based optoelectronic material.

4. The conjugated polymer-based optoelectronic material of claim 1, wherein said organic diluent is present in an amount of greater than 40 wt %, and said conjugated polymer is present in an amount of greater than 35 wt % based on a total weight of said conjugated polymer-based optoelectronic material.

5. The conjugated polymer-based optoelectronic material of claim 1, wherein said conjugated polymer is a thiophene derivative conjugated polymer.

6. The conjugated polymer-based optoelectronic material of claim 5, wherein said thiophene derivative conjugated polymer is poly[2-(thiophen-3-yl)ethyl acetate].

7. The conjugated polymer-based optoelectronic of claim 6, wherein said organic diluent is a phenol derivative.

8. A solid thin film made from a conjugated polymer-based optoelectronic material that comprises an optoelectronic conjugated polymer having a main chain and side chains, and an organic diluent which is at least partially miscible with said conjugated polymer, wherein molecules of said organic diluent physically react with said side chains of said conjugated polymer to form hydrogen bonds therebetween, thereby generating molecular constraints in said conjugated polymer to suppress molecular deformation of said conjugated polymer that occurs soon after said conjugated polymer is excited, wherein said organic diluent is present in an amount of greater than 9 wt % based on a total weight of said conjugated polymer-based optoelectronic material.

9. The conjugated polymer-based optoelectronic material of claim 1, wherein said organic diluent is present in an amount ranging from 23 to 90 wt % based on the total weight of said conjugated polymer-based optoelectronic material.

10. The conjugated polymer-based optoelectronic material of claim 9, wherein said organic diluent is present in an amount ranging from 41 to 66 wt % based on the total weight of said conjugated polymer-based optoelectronic material.

\* \* \* \* \*